United States Patent [19]

Hilliard, Jr. et al.

[11] 4,159,497
[45] Jun. 26, 1979

[54] SWITCH DEBOUNCE CIRCUIT

[75] Inventors: Milton E. Hilliard, Jr., Millers; Daniel J. Provine, Severna Park, both of Md.

[73] Assignee: The United States of America as represented by the Secretary of the Air Force, Washington, D.C.

[21] Appl. No.: 880,910

[22] Filed: Feb. 23, 1978

[51] Int. Cl.² ............................................. H02H 7/20
[52] U.S. Cl. ..................................... 361/2; 307/247 A
[58] Field of Search ........................ 361/2; 307/247 A

[56] References Cited

U.S. PATENT DOCUMENTS

| | | | |
|---|---|---|---|
| 2,864,007 | 12/1958 | Clapper | 307/247 A |
| 3,866,092 | 2/1975 | Burns | 361/2 |
| 4,045,692 | 8/1977 | Morokawa et al. | 307/247 A X |

Primary Examiner—Harry E. Moose, Jr.
Attorney, Agent, or Firm—Joseph E. Rusz; George Fine

[57] ABSTRACT

A switch debounce circuit buffers the mechanical contacts of a double throw single pole switch into digital logic. It is essentially an active debounce circuit requiring only one wire from the switch to the circuit. The circuit includes a pair of oppositely connected inverting logic amplifiers with a resistor coupled between the output of one amplifier and the input of the second amplifier. The input from the switch is connected to the same leg of the circuit as a resistor and the output is taken from an opposite leg connecting the output of the second amplifier to the input of the first amplifier. The propagation of logic signals is effected by changing the state of the switch but contact bounce does not effect the logic.

2 Claims, 1 Drawing Figure

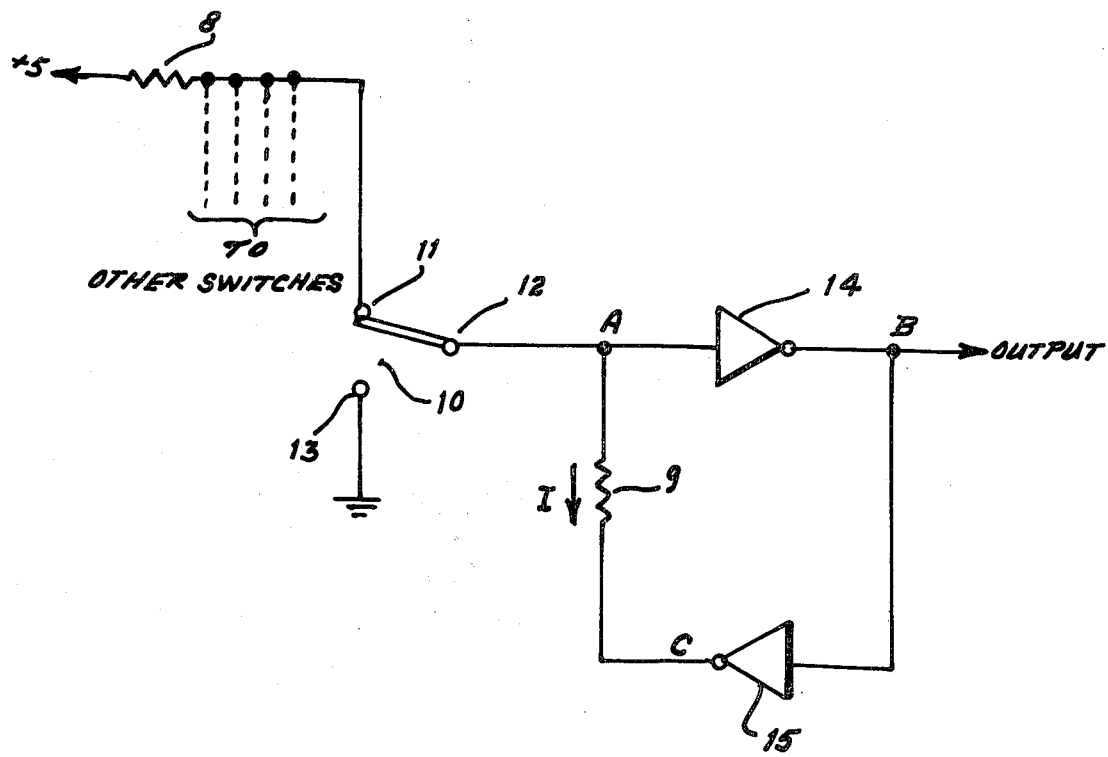

SWITCH DEBOUNCE CIRCUIT

STATEMENT OF GOVERNMENT INTEREST

The invention described herein may be manufactured and used by or for the Government for governmental purposes without the payment of any royalty thereon.

BACKGROUND OF THE INVENTION

Almost all present electronic systems require pushbutton switches that furnish signals to digital logic for system control. However, all pushbutton switches with dry mechanical contacts exhibit a "bounce" characteristic i.e., intermittently opening and closing for a short period after activation. When coupled directly with digital logic, this results in multiple or false detection of switch operation. Therefore, all such signals must be buffered, and the circuits used are termed "debounce" buffers or circuits. Two schemes for contact debounce are in common use. One is an active circuit which has been used featuring cross coupled nand gates. The primary disadvantage of this circuit is that it requires two wires from the pushbutton to the debounce circuit. This can lead to a large interface problem with complex control panels.

The second prior art apparatus is a passive circuit which uses an RC time constant to eliminate contact bounce. There are three disadvantages to this circuit. The first disadvantage is the slow rising edge. The second disadvantage is the analog discrete components. The third disadvantage is that different switches exhibit different bounce characteristics so no R/C combination is the optimum for all circuits. The present invention offers advantages over the prior art. It is an active circuit but with only one wire interfacing the pushbutton and the debounce circuit and includes fewer parts such as one resistor for a significant parts saving.

SUMMARY OF THE INVENTION

A switch debounce active circuit is provided. Only one wire from each switch is required. The circuit includes a pair of oppositely connected inverting logic amplifiers with a resistor coupled between the output of one amplifier and the input of the second amplifier. The input from the switch is connected to the same leg of the debounce circuit as the resistor and the output is taken from an opposite leg connecting the output of the second amplifier to the input of the first amplifier. The propagation of logic signals through the circuit is effected by changing the state of the switch but contact bounce will not produce any effect in the logic. In this manner, the circuit provides the desired buffering action.

BRIEF DESCRIPTION OF THE DRAWING

There is shown a single FIGURE of the preferred embodiment partly in block and partly in schematic form.

DESCRIPTION OF THE PREFERRED EMBODIMENT

The circuit operates as follows: assuming a steady state "off" condition as shown in the single FIGURE, the critical voltages are: voltage at A ($V_A$)—logic "1"; voltage at B ($V_B$)=logic "0"; and voltage at C ($V_C$)=logic "1".

In the process of moving switch 10 from pin 11 to 13, the contacts bounce at pin 11. During the opening or bounce time, the logic 1 state at A is supplied by inverting logic amplifier 15 at C. When the contact first strikes pin 13, the ground potential is forced at A causing a logic "1" at B which in turn causes a logic "0" at C. The propagation delay thru inverting logic amplifier 14 and 15 is nanoseconds while the switch bounce period is hundreds of microseconds. Thus, the logic "0" will reach C well before the first bounce and the voltage at A will be maintained at logic "0" by $V_C$ during the bounce cycle.

When the switch is returned to pin 11, the voltage divider of resistors 8 and 9 provides a logic 1 to A while protecting against excess currents at amplifier 15 output. This signal propagates to B as a logic 0 and then to C as a 1, returning to the original steady state condition.

The determination of resistors 8 and 9 ($R_1$ and $R_2$) depends on the mechanization. The generalized equations are as follows:

With the switch connecting pins 11 and 12, the voltage at point A is shown in equation 1.

$$V_A = V_C + \frac{R_2}{R_1 + R_2} V - V_C \qquad \text{EQUATION 1}$$

With the switch connecting pins 12 and 13, point A is ground.

When the switch is moving and not connected to pins 11 or 13, pin 2 is open and the voltage at A is shown in equation 2.

$$V_A = V_C + IR_2 \qquad \text{EQUATION 2}$$

This equation is valid whether $V_C$ is a logic 1 or 0, where I is the high or low level input current to amplifier 14.

For a given device, I and $V_C$ may be conservatively specified and resistor 9 ($R_2$) can be calculated so that $V_A$ is less than a logic "0" when $V_C$ is a "0" and the switch is open. Resistor 8 ($R_1$) is now calculated from equation 1 where $V_A$ is selected greater than a logic "1". (Note that a single resistor 8 ($R_1$) will serve all switches. Also note that conservative design practice would suggest that amplifier 14 have input clamp diodes such as TTL low power Schottky logic to prevent damage due to excessive input voltage generated by switch operation in the presence of distributed capacitance and inductance.)

As an example, if amplifier 14 and 15 are of the 54LS04 type, then $V_C(0)$ max=low level output voltage from amplifier 15=0.4v $V_C(0)$ min=0v I max=low level input current to amplifier 14=0.8v $R_{2max} = (0.8 - 0.4)V/0.36 = 1.1K$ $V_A(1)$=high level input voltage to amplifier 14=2.4V $R_2 = /(R_1 + R_2) = (2.4 - 0.4)V/(5 - 0.4)V$ $R_{1max} = 4.6/2 \times 1.1K - 1.1K = 1.3K$ Standard conservative design and derating practice might suggest a lower value for $R_1$ and $R_2$ but the calculating procedures would be the same.

Although the circuit is illustrated with +5V and ground, the concept can be used with any logic type (such as ECL) by substituting the correct voltage potentials as required.

We claim:

1. A debounce circuit for a switch having first, second and third pins, said second pin being connected to said first pin or said third pin, selectively said debounce circuit comprising means connecting said third pin to ground, a first resistor of predetermined magnitude connected from a preselected voltage to said first pin, first and second inverting logic amplifiers, each having an input and output, said first inverting logic amplifier being connected to said second pin by way of the associated input thereof, said output of said first inverting logic amplifier providing the resultant signal and also being connected to said input of said second inverting logic amplifier, and a second resistor of preselected magnitude connected from said input of said first inverting logic amplifier to said output of said second inverting logic amplifier, said first and second resistors in combination forming a preselected voltage divider.

2. A switch debounce circuit as described in claim 1 further including a multiplicity of single inputs connected to said first pin of said second switch.

* * * * *